United States Patent [19]

Kawakubo et al.

[11] Patent Number: 5,796,648
[45] Date of Patent: Aug. 18, 1998

[54] NONVOLATILE SEMICONDUCTOR MEMORY DEVICE AND METHOD FOR MANUFACTURING SAME

[75] Inventors: Takashi Kawakubo, Yokohama; Kazuhide Abe, Kawasaki, both of Japan

[73] Assignee: Kabushiki Kaisha Toshiba, Kawasaki, Japan

[21] Appl. No.: 762,923

[22] Filed: Dec. 10, 1996

[30] Foreign Application Priority Data

Dec. 11, 1995 [JP] Japan .................... 7-321698

[51] Int. Cl.⁶ .................................... G11C 11/22
[52] U.S. Cl. ............................... 365/145; 365/149
[58] Field of Search ....................... 365/145, 149; 257/295

[56] References Cited

U.S. PATENT DOCUMENTS 5,155,573  10/1992  Abe ............................. 365/149
5,250,827  10/1993  Inoue ........................... 365/145
5,469,324  11/1995  Henderson .................. 361/301.2
5,514,484   5/1996  Nashimoto .................... 365/145
5,615,145   3/1997  Takeuchi ...................... 365/145

Primary Examiner—A. Zarabian
Attorney, Agent, or Firm—Oblon, Spivak, McClelland, Maier & Neustadt, P.C.

[57] ABSTRACT

A nonvolatile semiconductor memory device has a ferroelectric cell and a paraelectric cell. The ferroelectric cell includes a first thin-film capacitor which has a first lower electrode formed on a substrate, a first dielectric film grown on the first lower electrode and a first upper electrode formed on the first dielectric film, and a first switching transistor connected to the first thin-film capacitor. The paraelectric cell includes a second thin-film capacitor which has a second lower electrode, a second dielectric film grown on the second lower electrode and a second upper electrode formed on the second dielectric film, and a second switching transistor connected to the second thin-film capacitor. The first lower electrode is provided such that the first dielectric film has ferroelectricities, while the second lower electrode is provided such that the second dielectric film has paraelectricities.

24 Claims, 6 Drawing Sheets

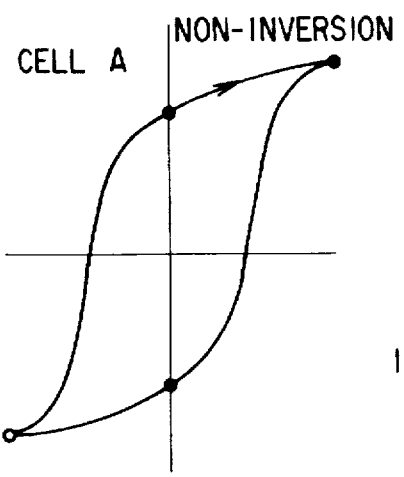
FIG. 2A
PRIOR ART
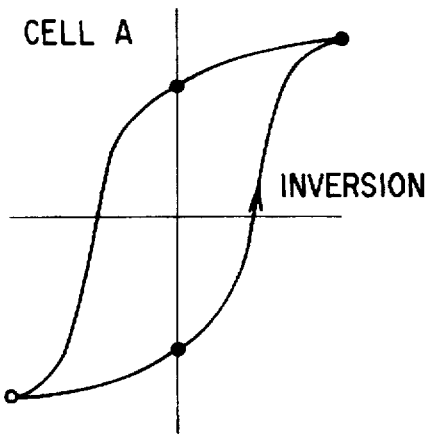
FIG. 2B
PRIOR ART
FIG. 2C
PRIOR ART
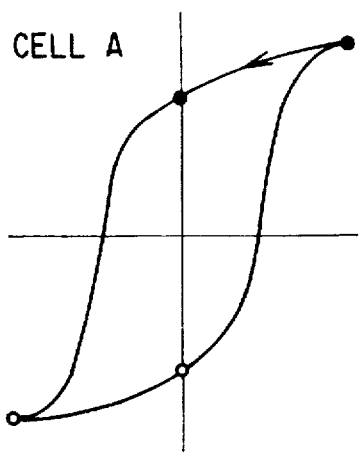
FIG. 2D
PRIOR ART
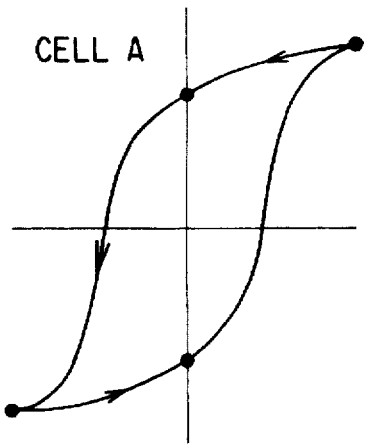
FIG. 2E
PRIOR ART DATA READ
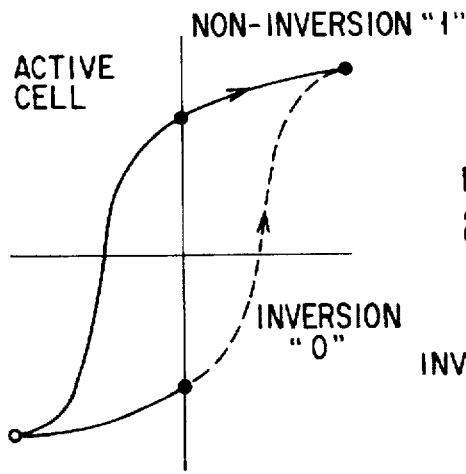
FIG. 4A
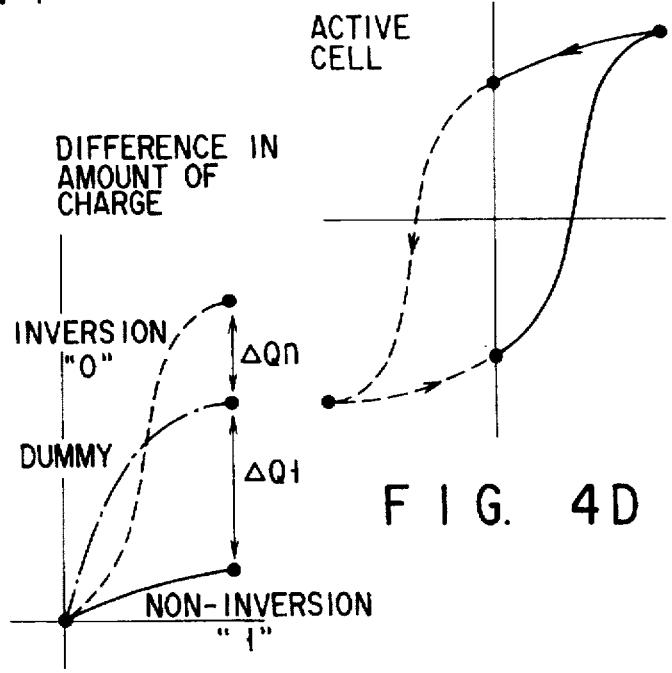
FIG. 4C
DATA REWRITE
FIG. 4D
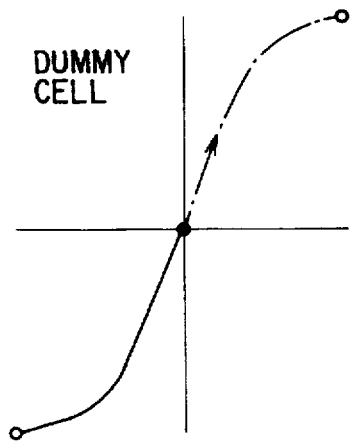
FIG. 4B
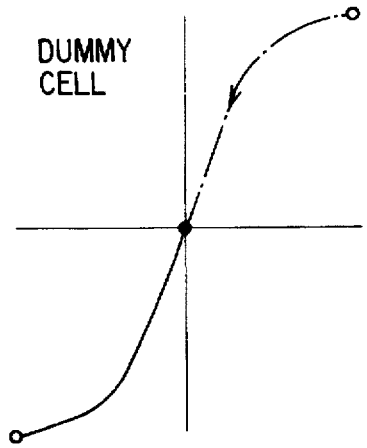
FIG. 4E

NONVOLATILE SEMICONDUCTOR MEMORY DEVICE AND METHOD FOR MANUFACTURING SAME

BACKGROUND OF THE INVENTION

1. FIELD OF THE INVENTION

The present invention relates to a nonvolatile semiconductor memory device comprising a ferroelectric cell which uses a ferroelectric film and a paraelectric cell which uses a paraelectric film. The present invention also relates to a method for manufacturing this type of nonvolatile semiconductor memory device.

2. DESCRIPTION OF THE RELATED ART

The storage media that are developed in recent years include ferroelectric memories (i.e., memory devices comprising a ferroelectric capacitor which uses a ferroelectric thin film), and some of the memory devices of this type are put to practical use. The ferroelectric memories are nonvolatile, and the data stored in them are not lost even after they are switched off. Where the films used in them are very thin, the inversion of spontaneous polarization is very quick, so that the speed at which data are written or read from them is as high as the corresponding speed of DRAMs.

Normally, two types of memory cell structures are known and employed in semiconductor memories which employ the ferroelectric thin films mentioned above.

In an ordinary type of the memory cell structure, one memory cell is made up of two transistors and two capacitors. An equivalent circuit diagram of this structure is shown in FIG. 1, and the principles underlying the data read operation of the structure are shown in FIGS. 2A–2E. As shown in FIG. 1, in an ordinary type of nonvolatile semiconductor memory, a unit cell is constituted by one transistor and one capacitor which employs one ferroelectric thin film. A memory cell 1 is constituted by a pair of unit cells which are located adjacent in the direction in which word lines WL extend.

In this type of nonvolatile semiconductor memory, data are written as follows: First of all, a word line WL of a predetermined row address is selected by a word line driving circuit 3. After the selected word line is activated, the switching transistor connected thereto is activated. Subsequently, a pair of bit lines BL and BL' are applied with complementary potentials (e.g., 5V and 0V) corresponding to information of "1" or "0". Simultaneous with this, a drive line DL is activated by a drive line driving circuit 2, and a write signal is supplied to the drive line DL. By this operation, the ferroelectric capacitors of the two unit cells of one memory cell are polarized in the opposite ways.

Thereafter, the activation of the word line is stopped, and the switching transistor is returned into the nonactive state. By so doing, the information of "1" or "0" is recorded and retained in the memory cell which is selected on the basis of the selections of the row address and column address. In this manner, information is written. Once the information is written, it is not erased or lost even when either the word line connected to the memory cell in which the information is stored or one of the drive line and bit line is activated.

To read out information, a word line WL of a predetermined row address is selected by means of the word line driving circuit 3, and the selected word line is activated so as to activate the switching transistor connected thereto. Subsequently, a pair of bit lines BL and BL' corresponding to a predetermined column address are precharged and set in the floating state. In this state, the bit lines BL and BL' are applied with predetermined potentials by activating the drive lines DL by means of the drive line driving circuit 2.

As in the manner mentioned above, one of the memory cells is selected by means of the selections of the row address and the column address. The information recorded and retained in the two capacitors polarized in the opposite manners is picked up by the pair of precharged bit lines through the switching transistor (FIG. 2), and the bit lines are made to have a very small potential difference which is based on the difference in the amount of charge corresponding to the difference between the inversion direction and non-inversion direction of the ferroelectric polarization. Therefore, when this potential difference is amplified by a sense amplifier 4, the same information as that of before being read out is written in the thin-film capacitors of the memory cell by the subsequent predetermined operation. In this manner, the information is written again. (FIGS. 2A–2E)

According to this method, the two adjacent capacitors are polarized in opposite ways, and when data are read, they are polarized in one way, and the difference between the amounts of charge accumulated is detected. Since this method is advantageous in that it is not much affected by a variation in the amounts of charge accumulated in the capacitors or the characteristic deterioration arising from the fatigue, it is often used in practice. However, since one memory cell is made up of two transistors and two capacitors, the required installation area is as twice as wide as the installation area of the case mentioned below, i.e., the case where one memory cell is made up of one transistor and one capacitor.

In the second type of memory cell structure, a dummy cell comprising one transistor and one thin-film capacitor is provided independently of a memory cell made up of one transistor and one thin-film transistor. An equivalent circuit diagram of this structure is shown in FIG. 3, and the principles underlying the data read operation are shown in FIGS. 4A–4E.

According to this method, the direction in which one ferroelectric thin-film capacitor of an active cell 1 is polarized is used as stored information. When the information is read out, a voltage is applied to the plate wires connected to the active cell 1 and dummy cell 5, and the amount of charge accumulated in the capacitor of the active cell 1 and that accumulated in the capacitor of the dummy cell 5 are compared with each other by use of the bit line and the sense amplifier 4. In comparison with the case where two transistors and two capacitors are used, the second type of memory cell structure is suitable for use as a large-capacitance memory, and the amounts of charge needed for comparison are less than half of the amounts of charge required in the first type of memory cell structure.

At the present time, the ferroelectric material used in the above semiconductor memories is normally a lead zirconate and titanate (PZT). PZT is a solid solution of lead zirconate and lead titanate. It is generally thought that a PZT in which lead zirconate and lead titanate are mixed with each other in the molar ratio of about 1:1 is suitable for application to a memory device, since spontaneous polarization is large in this type of PZT, and inversion occurs easily in response to a low electric field. Since the transition temperature (Curie temperature) at which a PZT changes between a ferroelectric phase and a paraelectric phase is comparatively high (it is higher than 300° C.), the data stored in the memory is not lost as long as it is used in the temperature range (a temperature less than 120° C.) in which an ordinary type of electronic circuits are used.

However, it is known that PZT thin films are hard to manufacture. One reason for this is that the lead, which is the main component of the PZT, easily evaporates at a temperature higher than 500° C., and this makes it difficult to accurately control the composition of the PZT. Another reason is that although a ferroelectricity can be obtained only when the PZT has a perovskite structure, the PZT cannot be easily provided with this crystal structure. In general, a crystal structure referred to as a pyrochlore structure can be obtained more easily than the perovskite structure. It should be also noted that a thin PZT film cannot be easily applied to a silicon device since the lead, the main component of the PZT, is not reliably prevented from being diffused into silicon.

Except the PZT mentioned above, barium titanate ($BaTiO_3$) is known as a generally-used ferroelectric material. Barium titanate can be provided with a perovskite structure, like a PZT, and has a Curie temperature of about 120° C. In comparison with Pb, Ba does not easily evaporate, and the composition control is relatively easy in the process of forming a barium titanate thin film. It should be also noted that barium titanate hardly assumes a crystal structure other than a perovskite structure when it is crystallized.

In spite of these advantages, a thin-film capacitor formed of barium titanate is rarely considered for use as the storage medium of a ferroelectric memory. One reason for this is that the residual polarization of the barium titanate is small in comparison with that of PZT and yet it is dependent largely on the temperature. This phenomenon is attributable to the low Curie temperature (120° C.) of barium titanate. If a ferroelectric memory is fabricated by use of this kind of ferroelectric material, it is likely that not only the data stored in the memory will be lost on exposure to a temperature higher than 100° C., but also the operation will be unstable in the temperature range (less than 85° C.) within which electronic circuits are used, since the residual polarization of the barium titanate is dependent largely on the temperature. Under the circumstances, it is generally thought that a thin-film capacitor comprising a ferroelectric thin film formed of barium titanate is not suitable for use as the storage medium of a ferroelectric memory.

In consideration of the above problems, the inventors of the present invention aimed at developing a novel ferroelectric film. In an effort to attain this aim, the inventors considered using a dielectric material which had a relatively large lattice constant but was close to the lattice constant of a lower electrode (e.g., the (100) plane of Pt). As an example of such a dielectric material, the inventors selected $Ba_xSr_{1-x}TiO_3$ (barium/strontium titanate). Further, the inventors adopted a film formation method wherein misfit dislocation hardly occurs in the film formation process which is so-called an RF magnetron sputtering process. By use of this method, epitaxial growth was made to take place in the c axis direction (i.e., the axis of polarization). By this epitaxial growth, even a comparatively thick film having a thickness of 200 nm or more was allowed to have an increased lattice constant in the thickness direction (axis c) and a decreased lattice constant in the planar direction (axis a).

The research made by the inventors showed that it was possible to develop a ferroelectric thin film which had a Curie temperature controlled to be in a high-temperature range, showed a marked residual polarization at room temperature, and could maintain this marked residual polarization even when the temperature was increased to 85° C. or so. In the case where the lower electrode was formed of Pt (lattice constant a: 0.39231) which was hardly oxidized and where the dielectrics was formed of barium strontium titanate having a predetermined composition ($Ba_xSr_{1-x}TiO_3$ |x=0.30–0.90|) which will be hereinafter referred to simply as a BST), the dielectric thin film developed by the inventors exhibited a ferroelectricity in the composition region ($x \leq 0.7$) wherein an ordinary dielectric thin film would not show the ferro-electricity at room temperature. In addition, the dielectric thin film developed by the inventors had a remarkably increased Curie temperature in the composition region ($x > 0.7$) wherein the ordinary dielectric thin film would show the ferroelectricity at room temperature. These ferroelectricities, which are very advantageous in practice, were experimentally confirmed by the inventors of the present invention.

However, if this ferroelectric material is used for manufacturing the nonvolatile semiconductor memory mentioned above, the following problem may occur.

In general, the following two methods are known in the art. In one of the methods, the capacitor of a dummy cell has the same structure and area as the capacitor of an active cell, and is polarized in one direction at all times. By varying the activating potential of the dummy drive line at the time of data reading, the amount of charge is controlled to be intermediate between the amount of charge retained by the capacitor of the active cell when this capacitor is polarized in an inverted state and the amount the charge retained by the capacitor when this capacitor is polarized in a noninverted state. In the other method, the capacitor of a dummy cell has the same structure as the capacitor of an active cell, but differs in area from the capacitor of the active cell.

However, in the case where the capacitor of the dummy cell is made of a ferroelectric thin film similar to the capacitor of the active cell, the ferroelectric thin-film capacitor may vary in performance at the time of residual polarization, or may deteriorate in performance due to the fatigue arising from the repeated residual polarization. In addition, if the residual polarization of one direction is maintained for a long time, the polarization characteristics may vary (which phenomenon is referred to as imprint). As can be seen from these, the ferroelectric thin-film capacitor is not very stable in characteristics, and a highly reliable semiconductor memory cannot be easily manufactured.

The capacitor of a dummy cell may be made of a capacitor which has an MOS junction (a metal/oxide/ semiconductor junction) and which employs a thermally oxidized Si film. In this case, the manufactured dummy cell is very reliable in performance. However, the dielectric constant of the thermal oxide film is far smaller than that of the ferroelectric film (it is about one hundredth of the dielectric constant of the ferroelectric film). Due to this, the dummy cell is inevitably large in area, the number of steps required is large, or another problem is produced.

SUMMARY OF THE INVENTION

Accordingly, an object of the present invention is to provide a nonvolatile semiconductor memory device which is reliable in operation and in which a paraelectric cell and ferroelectric cell, both small in area, are arranged on the same substrate.

To attain this object, the present invention provides a nonvolatile semiconductor memory device which comprises a ferroelectric cell and a paraelectric cell, the ferroelectric cell including: a first thin-film capacitor which comprises a first lower electrode formed on a substrate, a first dielectric film grown on the first lower electrode, and a first upper electrode formed on the first dielectric film; and a first switching transistor connected to the first thin-film capacitor, the paraelectric cell including: a second thin-film capacitor which comprises a second lower electrode, a second dielectric film grown on the second lower electrode, and a second upper electrode formed on the second dielectric film; and a second switching transistor connected to the second thin-film capacitor, the first lower electrode being provided such that the first dielectric film has ferroelectricities, and the second lower electrode being provided such that the second dielectric film has paraelectricities.

The present invention also provides a nonvolatile semiconductor memory device which comprises a ferro-electric cell and a paraelectric cell, the ferro-electric cell including: a first thin-film capacitor which comprises a first lower electrode formed on a substrate, a ferroelectric dielectric film made of a single crystal dielectric material which is epitaxially grown on the first lower electrode and a first upper electrode formed on the ferroelectric dielectric film; and a first switching transistor connected to the first thin-film capacitor, the paraelectric cell including: a second thin-film capacitor which comprises a second lower electrode, a paraelectric dielectric film grown on the second lower electrode and a second upper electrode formed on the paraelectric dielectric film; and a second switching transistor connected to the second thin-film capacitor, the ferroelectric dielectric film having an original Curie temperature which is at least 50° C. higher than that of the paraelectric dielectric film.

The present invention further provides a method for manufacturing a nonvolatile semiconductor memory device, comprising the steps of: forming a first lower electrode and a second lower electrode on a substrate; forming a first dielectric film having ferro-electricities on the first lower electrode by epitaxially growing a dielectric material having a lattice constant different from that of the first lower electrode, and forming a second dielectric film having paraelectricities on the second lower electrode, the paraelectricities of the second dielectric film being controlled in accordance with a strain acting between the second dielectric film and the second lower electrode; and providing a first upper electrode on the first dielectric film, thereby forming a ferroelectric cell, and providing a second upper electrode on the second dielectric film, thereby forming a paraelectric cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A–2E show principles underlying an operation of reading data from the memory cell shown in FIG. 1 and an operation of writing data again in that memory cell;

FIGS. 4A–4E show principles underlying an operation of reading data from the memory cell shown in FIG. 3 and an operation of writing data again in that memory cell;

DETAILED DESCRIPTION OF THE PREFERRED EMBODIMENTS

Figure 1:
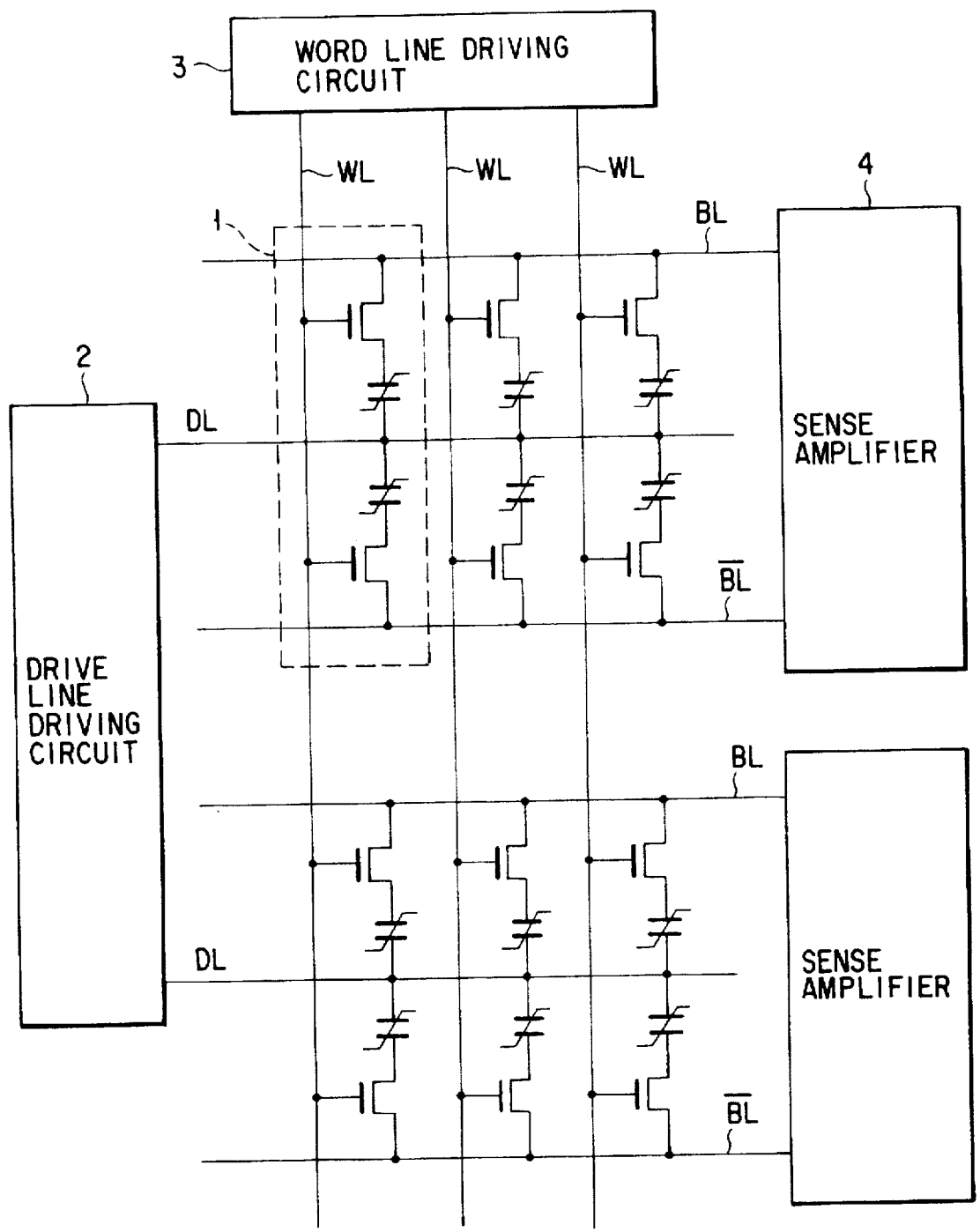
FIG. 1 shows an equivalent circuit diagram of a conventional memory cell which is made up of two transistors and two capacitors.
Figure 3:
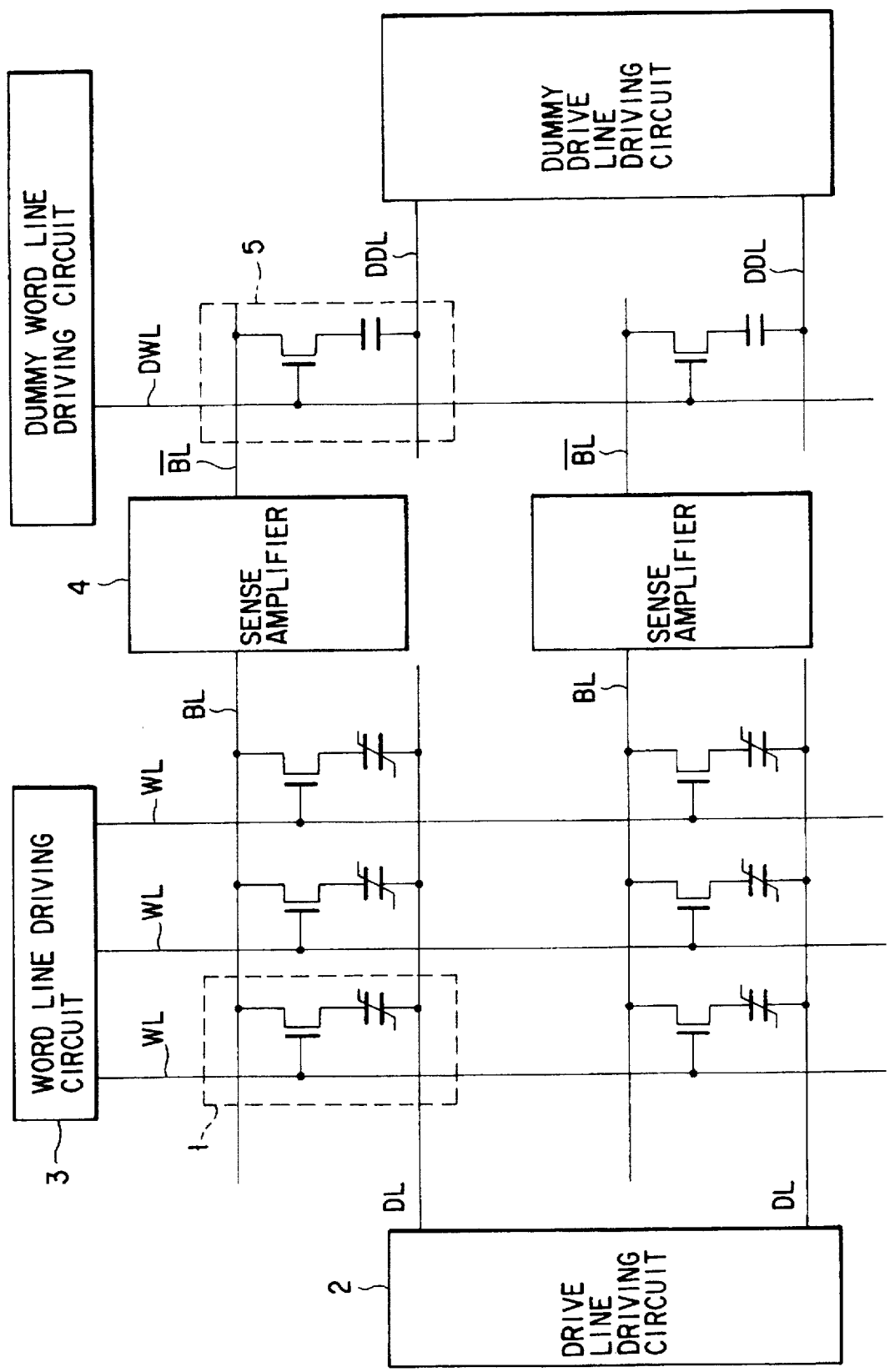
FIG. 3 shows an equivalent circuit diagram of a conventional memory cell comprising an active cell and a dummy cell, each of which is made up of one transistor and one capacitor.

The principles underlying the present invention will now be described in detail.

The present invention is based on the discovery that an ideal nonvolatile memory can be obtained by designing it to comprise a ferroelectric cell and a paraelectric cell and by providing these cells with perovskite thin-film capacitors which are similar in structure and composition.

The inventors paid attention to the fact that the control of dielectric characteristics required for application to a nonvolatile memory could be attained by varying the strain applied to thin-film capacitors of a perovskite structure. Namely, the strain applied to the dielectric thin films could be varied, by controlling the dielectric thin-film capacitors of a perovskite structure to have a single crystal structure or a polycrystalline structure, by varying the composition of the dielectric thin films to change the lattice constant thereof, or by varying the composition of an electrode to change the lattice constant of the electrode so as to causing the strain to the dielectric films.

By way of example, let us consider a dielectric material expressed as $Ba_xSr_{1-x}TiO_3$ (BST). A polycrystal film formed of this dielectric 3material does not exhibit ferroelectricities as long as its thickness is less than 300 nm or so. This holds true even of the case where the Ba content is 100% (in which case the Curie temperature is highest). In contrast, a single crystal film formed by epitaxial growth serves as a ferroelectric film.

Therefore, a memory cell having ferroelectricities and a memory cell having ferroelectricities can be formed by use of BST dielectric films which are the same in composition and thickness. To be more specific, the thin-film capacitor of the ferroelectric memory cell is formed of a single crystal dielectric film, thereby forming an active cell, while that of the paraelectric memory cell is formed of a polycrystal dielectric film. In this case, the lower electrode formed of platinum (Pt) or the like may be of either a single crystal structure or a polycrystalline structure, and the crystal type of the lower electrode determines the crystal type (single crystal or poly-crystal) of the dielectric film formed on the lower electrode.

Even when a BST dielectric film is formed by epitaxial growth, either a dielectric film or a paraelectric film can be obtained by varying the Curie temperature in accordance with the amount of strain caused by the epitaxial growth. To be more specific, the original Curie temperature of a BST single crystal is nearly equal to the room temperature when the Ba content is 70% (x=0.7) or thereabouts. Therefore, the BST single crystal serves as a ferroelectric material if the Ba content is larger than 70% and serves as a paraelectric material if the Ba content is small than 70%. However, where a BST film is epitaxially grown on a single crystal platinum film having a somewhat smaller lattice constant and a compressive strain of 2–3% is introduced in the plane, the BST film serves as a ferroelectric film at a Ba content of 30% or higher.

Accordingly, a memory comprising a ferroelectric film and a paraelectric film can be provided by use of a BST dielectric material having the same composition and thickness, i.e., the BST dielectric material is epitaxially grown on a single crystal lower electrode film having a slightly different lattice constant.

It is desirable that the difference between the lattice constants of the lower electrodes of the ferroelectric and paraelectric cells is greater than 0.2% for the dielectric film of the ferroelectric cell to have strain for producing marked residual polarization. If the difference in lattice constant is smaller than 0.2%, the dielectric film of the ferroelectric cell whose Curie temperature is smaller than the room temperature cannot have strain sufficient for increasing the Curie temperature marked residual polarization.

Likewise, a memory comprising a ferroelectric film and a paraelectric film can be provided by controlling the composition of a BST dielectric material, by varying the Ba content higher or lower than the boundary value between ferroelectric and paraelectricities and epitaxially growing this composition-controlled BST dielectric material on a single crystal lower electrode film.

It is desirable that the original Curie temperature of the ferroelectric film of the ferroelectric cell and the original Curie temperature of the para-electric film of the paraelectric cell be differ from each other by 50° C. or more, since this temperature difference contributes to the exhibition of marked residual polarization. If the temperature difference is smaller than 50° C., the ferroelectric film of the ferroelectric cell does not exhibit marked residual polarization.

In a nonvolatile semiconductor memory device embodying the present invention, it is desirable that the original Curie temperature of the dielectric material be not more than 200° C. One reason for this is that the advantage of the present invention (i.e., an increase in the Curie temperature) is particularly remarkable when applied to a dielectric material having a comparatively low original Curie temperature. Another reason is that when a dielectric film having ferroelectricities is formed on a conductive substrate by epitaxial growth, the axis of polarization is sufficiently aligned in the direction of the thickness, and hence the dielectric film does not greatly deteriorate in performance after it is repeatedly subjected to polarized inversion.

According to the present invention, in order to significantly increase the value of residual polarization and the capacitance for reliable use in practice, the ratio of $a_d$ ($a_d$: an original lattice constant of the dielectric material of the dielectric film) to $a_s$ ($a_s$: an original lattice constant of the conductive material of the substrate on which the dielectric film is formed) should preferably within the range of $1.002 \leq a_d/a_s \leq 1.015$. When ratio $a_d/a_s$ is in this range, the dielectric film is allowed to have a sufficiently great thickness, and the lattice of the perovskite crystal structure is reduced in the direction of axis a and elongated in the direction of axis c.

As described above, ratio $a_d/a_s$ should be not less than 1.002. If it is less than 1.002, the Curie temperature of the dielectric film does not exceed the original Curie temperature of the dielectric material. Even if it does increase, the increment is nothing but a very small value. On the other hand, ratio $a_d/a_s$ should be not more than 1.015. If it is more than 1.015, misfit dislocation is introduced when a dielectric film is being epitaxially grown on a conductive substrate, and a significant increase in the Curie temperature cannot be expected in respect of a thick dielectric film whose thickness is 70 nm or more. In addition, even if the Curie temperature can be increased in respect of a thin dielectric film whose thickness is 70 nm or less, the increment is nothing but a very small value in practice. If ratio $a_d/a_s$ is between 1.002 and 1.011, the misfit of the lattice constant is of a small value, and a dielectric film having a satisfactory crystal structure can be easily formed by epitaxial growth without reference to the film formation temperature.

As described above, the present invention is intended to form a dielectric film having a perovskite crystal structure whose lattice is reduced in the direction of axis a and elongated in the direction of axis c. The Curie temperature increases from its original value by causing strain acting in the predetermined direction by utilization of the difference between the lattice constant of the dielectric film and that of the substrate on which the dielectric film is formed. In the case of a dielectric material whose Curie temperature is lower than 200° C., the crystal structure is not very anisotropic at room temperature. In other words, the spontaneous stain of the lattice is not very marked. Since, therefore, the strain intentionally caused in the lattice is hardly canceled by the spontaneous strain, the intentional introduction of strain in the lattice is very advantageous in practice.

In the case of a dielectric material whose Curie temperature is higher than 200° C., a great spontaneous strain is present in the lattice in many cases. When the dielectric material is epitaxially grown on a conductive substrate, 90° domains which are different in the directions of spontaneous strain of lattice are produced in the dielectric film, in order to relieve the stress and deelectrifying field at the time of film formation. Therefore, one-direction strains intentionally caused in the lattice are canceled by the multi-direction spontaneous strains of lattice, and it is therefore likely that the Curie temperature will rise only slightly. If 90° domains which are mutually different in the directions of spontaneous strain of lattice are produced in the dielectric film, those domains whose axes of polarization are orientated in the film plane are inverted by 90° when an electric field is applied in the thickness direction of the dielectric film. Such inversion results in deterioration in performance after repetition of polarized inversion. In general, a dielectric material whose Curie temperature is higher than 200° C. contains Pb and Bi as main components. Since the Pb and Bi components may evaporate when a dielectric film is formed, the intended composition of this film is hard to attain. Hence, a dielectric film having satisfactory quality cannot be easily manufactured. In addition, the dielectric material whose Curie temperature is higher than 200° C. does not require any special treatment when it is used for forming a dielectric film. This is because 200° C. is sufficiently high as a Curie temperature and does not become a problem when the dielectric material whose Curie temperature is higher than this temperature is used for forming the capacitor of a memory cell of a semiconductor memory device. In summary, even if the present invention is applied to a dielectric material having such a high Curie temperature, the advantage of the present invention (i.e., an increase in the Curie temperature) is not very remarkable.

In the nonvolatile semiconductor memory device of the present invention, the lower electrode may be formed of a conductive compound as the base film for introduction of strain. When the introduction of compressive strain is intended, the lower electrode is formed, for example, of an alloy which mainly contains platinum (lattice constant: 0.3923 nm) and additionally contains palladium (lattice constant: 0.3890 nm) and iridium (lattice constant: 0.3839 nm). (Palladium and iridium are added to the alloy in accordance with the need.) If no compressive strain is required or the introduction of tensile strain is desired, the lower electrode is formed, for example, of an alloy which mainly contains both platinum and gold (lattice constant: 0.4078 nm).

Likewise, the lower electrode may be formed of a conductive compound, such as $SrRuO_3$ or $SrMoO_3$. Since the lattice constant of $SrRuO_3$ or $SrMoO_3$ is far smaller than that of BST, a BST dielectric film provided on a lower electrode is allowed to have compressive strain if the lower electrode is formed of $SrRuO_3$, $SrMoO_3$, or another conductive compound having a similar lattice constant. In addition, a mixed crystal made from a plurality of conductive compounds may be used for forming the lower electrode. A mixed crystal made from $SrRuO_3$ and $CaRuO_3$ has a lattice constant smaller than that of $SrRuO_3$, and the use of this mixed crystal as the material of the lower electrode is effective in promoting introduction of compressive strain, i.e., in enhancing the ferroelectricities. A mixed crystal made from $SrRuO_3$ and $BaRuO_3$ and a mixed crystal made from $SrMoO_3$ and $BaMoO_3$ have large lattice constants. Where these mixed crystals are used for forming the lower electrode, the introduction of strain into the BST dielectric film is suppressed in accordance with the content of $BaRuO_3$ or $BaMoO_3$, causing the BST dielectric film to exhibit paraelectricities. In this manner, the dielectric characteristics of the BST dielectric film can be controlled by selecting a mixed crystal of which to form the lower electrode and varying the composition of the mixed crystal.

The dielectric material having a perovskite crystal structure according to the present invention may be a simple perovskite oxide such as $BaTiO_3$, $SrTiO_3$, $CaTiO_3$, $BaSnO_3$, or $BaZrO_3$, a complex perovskite oxide such as $Ba(Mg_{1/3}Nb_{2/3})O_3$ or $Ba(Mg_{1/3}Ta_{2/3})O_3$, or a substance in which some of these oxides are contained in solid solution. Needless to say, the composition of the materials may be somewhat deviated from stoichiometric ratio as long as the deviation does not adversely affect the advantages of the present invention.

In the case where the dielectric material is made of a mixed crystal in which $BaTiO_3$ is mixed with $SrTiO_3$ or $CaTiO_3$, the strain introduced into the dielectric material can be controlled since the lattice constant of that mixed crystal is smaller than that of $BaTiO_3$. Accordingly, the dielectric characteristics of the dielectric film can be controlled, as mentioned above.

When the dielectric film formed of a dielectric material is provided on a conductive substrate, the epitaxial growth is preferably conducted in such a manner that the (001) planes of the tetragonal systems of the dielectric film and conductive substrate or the (100) planes of the cubic systems thereof are parallel to each other. As a method for forming the dielectric film, reactive deposition, RF sputtering, laser application, MOCVD, or like is used. In terms of introducing strain sufficiently, sputtering is most desirable. The thickness of the dielectric film should be greater than 20 nm since such a thick dielectric film ensures sufficient residual polarization or a satisfactory effective dielectric constant when applied to a ferroelectric memory. In practical, it is desirable that the thickness of the dielectric film be within the range of 30 nm to 100 μm.

In the above, reference was made of the case where the ferroelectric cell was an active cell and the paraelectric cell was a dummy cell. However, the paraelectric cell may be a DRAM memory cell. That is, the ferroelectric cell and the paraelectric cell may be an FRAM memory cell and a DRAM memory cell, respectively.

Where the ferroelectric material described above is used as a DRAM memory cell, it is possible to provide a capacitor which is sufficiently thin, ensures a satisfactory dielectric constant and suppresses a leak current.

A description will now be given of a method for manufacturing the nonvolatile semiconductor of the present invention.

To manufacture the nonvolatile semiconductor memory device mentioned above, the method provided by the present invention produces strain between a first lower electrode and a first dielectric film epitaxially grown on the first lower electrode, thereby causing the first dielectric film to have ferroelectricities. In addition, the method reduces the strain between a second lower electrode and a second dielectric film, thereby causing the second dielectric film to have paraelectricities.

Prior to the step of forming the second dielectric film, it is desirable to execute a step of roughening the substrate region on which the second dielectric film is to be provided. A layer formed on such a roughened region never fails to have a polycrystalline structure even if that layer is formed under the conditions for the epitaxial growth. The roughened region may be provided for any one of a lower electrode, a substrate, a contact plug formed in contact with the substrate, a barrier layer formed between the contact plug and the lower electrode, etc.

Where the roughened region is provided, the first dielectric film and the second dielectric film can be formed at one time. Where the substrate has a roughened surface region, a layer formed on this roughened region has a polycrystalline structure, as mentioned above. Therefore, a predetermined surface portion of the substrate is roughened prior to the formation of the first and second dielectric films. Subsequently, the first and second dielectric films are simultaneously formed under the epitaxial growth conditions. The first and second dielectric films, thus formed, have ferroelectricities and para-electricities, respectively.

The roughened surface mentioned above is provided by RIE etching and wet etching or by another suitable process. Alternatively, the roughened surface may be provided by forming a polycrystal layer under different film formation conditions.

A contact plug is made to have a roughened surface as follows. The contact plug is formed of Si doped with $AsH_3$ or $B_2H_6$ by utilization of LPCVD process. If, in this process, dichlorosilane is used and treatment is performed at a temperature range of 360° C. to 500° C., the contact plug is made to have a single crystal structure. If, in the LPCVD process, silane or disilane is used and treatment is performed at a temperature range of 600° C. to 650° C., the contact plug is made to have a polycrystalline structure.

A barrier of TiN is made to have a roughened surface as follows. The barrier is a TiN layer formed by utilization of reactive sputtering. If, in this process, treatment is performed at a temperature higher than 600° C., the barrier is made to have a single crystal structure. If, in the process, treatment is performed at a temperature lower than 400° C., the barrier is made to have a polycrystalline structure.

A lower electrode layer of platinum is made to have a roughened surface as follows. The lower electrode is a platinum layer formed by utilization of sputtering. If, in this process, treatment is performed at a temperature higher than 500° C., the lower electrode is made to have a single crystal structure. If, in the process, treatment is performed at a temperature lower than 300° C., the lower electrode is made to have a polycrystalline structure.

According to the method of the present invention, at least one of the first and second dielectric films may be formed of a mixed crystal, and the ferro-electricities may be controlled by varying the composition of the mixed crystal. In this case, it is preferable that the first and second dielectric films be formed independently of each other.

Likewise, at least one of the first and second lower electrodes may be formed of a mixed crystal, and the ferroelectricities may be controlled by varying the composition of the mixed crystal. In this case as well, it is preferable that the first and second lower electrodes films be formed independently of each other. Such lower electrodes are used in combination of the dielectric films mentioned above.

As detailed above, the present invention does not use lead or bismuth which is a low-melting point metal and cannot be easily used in a silicon process. According to the present invention, a ferroelectric film which is induced in accordance with the strain introduced in the epitaxial growth is used as a ferroelectric cell, and a paraelectric film which is similar in structure and composition to the ferro-electric film is used as a paraelectric cell. The use of these two kinds of cells enables the manufacture of a nonvolatile semiconductor memory element which is very reliable in performance and highly integrated.

The present invention will now be described, referring to the examples.

EXAMPLE 1

In this Example, an active cell (i.e., a ferroelectric cell) is formed of a strain-induced ferroelectric film which is formed by utilizing the mismatching strain produced during epitaxial growth. A dummy cell (i.e., a paraelectric cell) is formed of a polycrystal paraelectric film. By use of these cells, a ferroelectric memory is fabricated.

FIGS. 5A–5H and FIGS. 6A–6F are schematic sectional views showing how a nonvolatile semiconductor memory element is manufactured according to Example 1. FIGS. 5A–5D and FIGS. 6A–6C show the process for manufacturing the active cell, while FIGS. 5E–5H and FIGS. 6D–6F show the process for manufacturing the dummy cell.

Figure 5A:
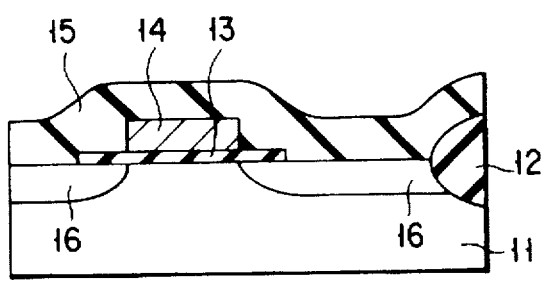
FIGS. 5A–5H are sectional views showing how a memory cell according to one embodiment of the present invention is manufactured.
Figure 5E:
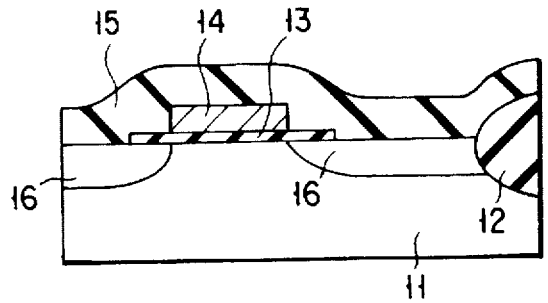

FIGS. 5A and 5E show how the transistor section and interlayer insulating film 5 of a memory cell are formed. The active cell depicted in FIG. 5A and the dummy cell depicted in FIG. 5E are of the same structure. In FIGS. 5A and 5E, reference numeral 11 denotes a silicon substrate of a first conductivity type. An element isolating oxide film 12 is formed on the silicon substrate 11, and a gate oxide film 13 and a word line 14 are formed on each of the regions isolated by the element isolating oxide film 12. Reference numeral 15 denotes an interlayer insulating film, while reference numeral 16 denotes an impurity diffusion layer of a second conductivity type.

Figure 5B:
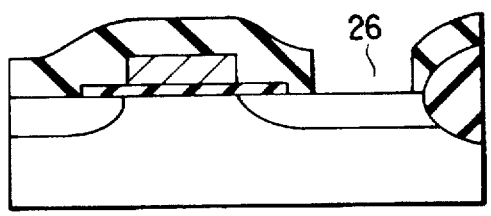
Figure 5F:
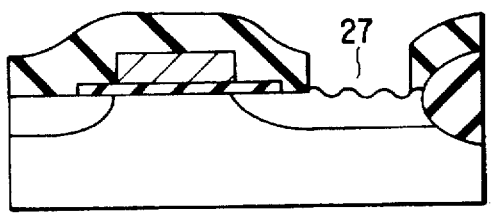

Contact holes 26 and 27 were formed in the interlayer insulating films 15, as shown in FIGS. 5B and 5F. The contact hole 26 of the active cell was formed in two steps: first, the interlayer insulating film was etched out to a depth of 80% or so by reactive ion etching (RIE), and subsequently, etching was made to take place to the surface of the silicon substrate 11 by use of a hydrofluoric acid aqueous solution, thereby exposing the (100) plane of the silicon. The contact hole 27 of the dummy cell was formed by over-etching by using RIE throughout. A (111) facet was formed in the surface of the silicon substrate 11 exposed in the contact hole 27.

Figure 5C:
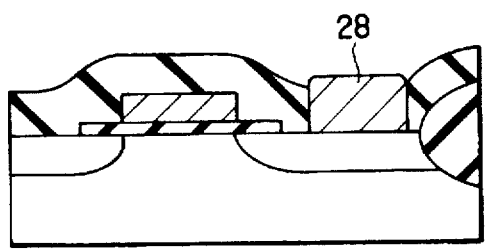
Figure 5G:
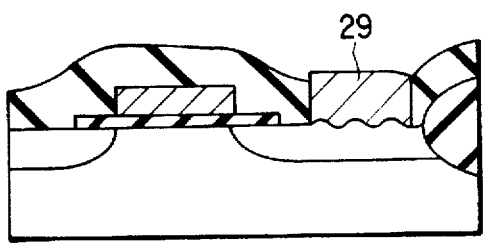

Next, as shown in FIGS. 5C and 5G, contact plugs 28 and 29 were formed by use of CVD technology for selectively growing silicon. To be more specific, the contact plugs were formed by selectively filling the contact holes 26 and 27 with silicon, and silicon was deposited by LPCVD process using dichlorosilane as a raw gas, and the silicon growing temperature was 820° C. Inside the contact hole of the active cell, a single crystal contact plug 28 was grown in the direction perpendicular to its (100) plane on the (100) plane of the silicon. Inside the contact hole of the dummy cell, in contrast, a polycrystal contact plug 29 was formed on the (111) facet.

Figure 5D:
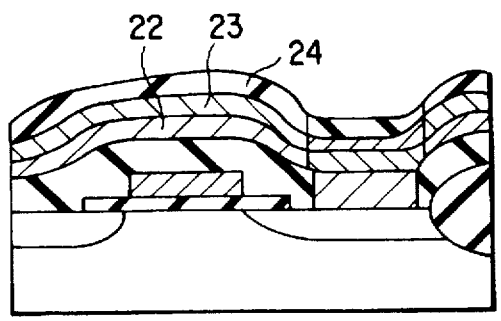
Figure 5H:
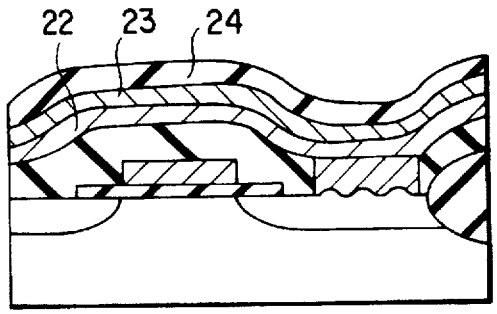

As shown in FIGS. 5D and 5H, the contact plugs were subsequently etched back and flattened by wet selective etching using hydrofluoric acid. Thereafter, a TiN film 22, which serves as a barrier layer, was formed by reactive sputtering at a temperature of 600° C. In addition, a platinum thin film 23, which serves as a lower electrode, was formed by sputtering at a temperature of 600° C. Further, a BST thin film 24, which contained Ba in a molar ratio of 80%, was grown to have a thickness of 100 nm by sputtering at a temperature of 600° C. A polycrystal was grown on the interlayer insulating film 15 and the polycrystal contact plug 29, while the TiN film 22, platinum thin film 23 and the BST dielectric film 24 were epitaxially grown in the direction perpendicular to each of (100) plane on the single crystal silicon plug of the active cell.

Figure 6A:
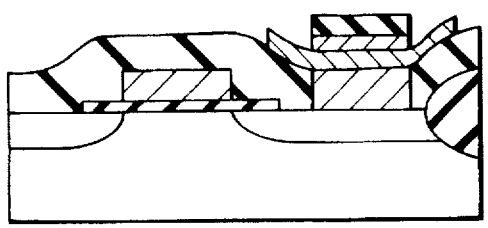
FIGS. 6A–6F are also sectional views showing how the memory cell according to the embodiment is manufactured.
Figure 6B:
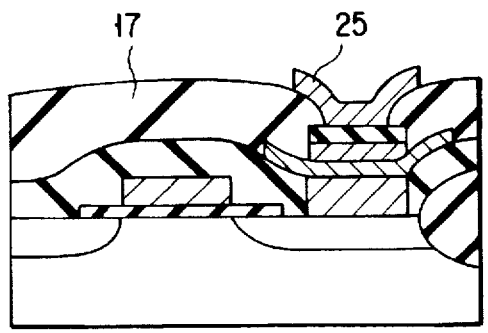
Figure 6C:
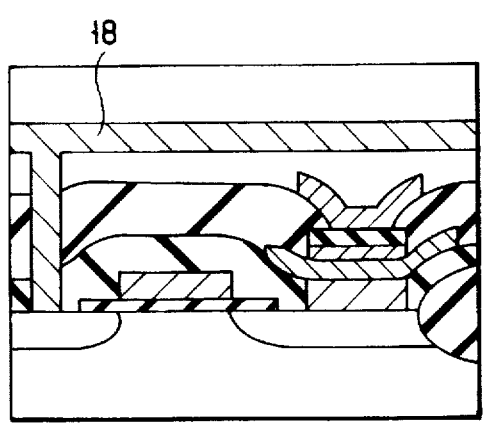
Figure 6D:
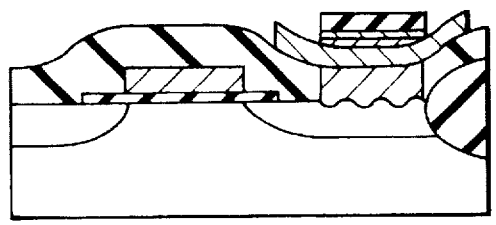
Figure 6E:
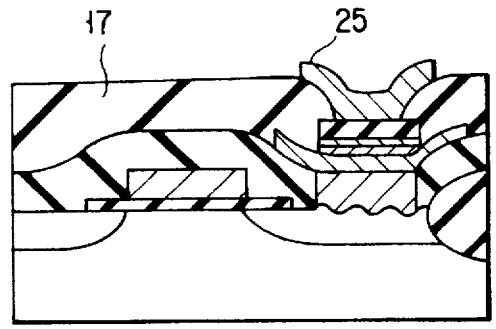
Figure 6F:
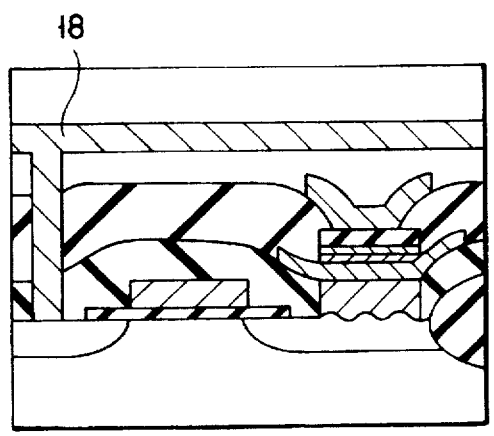

As shown in FIGS. 6A and 6D, the BST dielectric film 24, the platinum thin film 23 and the TiN film 22 were patterned by use of photolithography and ion etching, thereby forming a dielectric layer 24, a lower electrode layer 23 and a barrier layer 22. As shown in FIGS. 6B and 6E, an interlayer insulating film 17 was subsequently deposited. A hole was formed in the interlayer insulating film 17 by use of both photolithography and ion etching, and a nickel upper electrode 25 was formed. Then, as shown in FIGS. 6C and 6F, another hole was formed in the interlayer insulating film 17 by use of both photolithography and ion etching, and a bit line 18 was formed therein.

The dielectric thin-film capacitor of the active cell, thus formed, was measured to check its characteristics. The measurement showed that the residual polarization of the dielectric thin-film capacitor was as large as 0.12 C/m$^2$. It was therefore confirmed that the dielectric thin-film capacitor functioned as a ferroelectric capacitor. Likewise, the dielectric thin-film capacitor of the dummy cell was measured to check its characteristics. The measurement showed that this capacitor did not exhibit ferroelectricities. The capacitor of the dummy cell had a dielectric constant of 330 when a bias of 0V was applied thereto, and was therefore paraelectric. It was also confirmed that the device of Example 1 functioned as a nonvolatile semiconductor memory device in a very stable manner by using the active and dummy cells in combination.

EXAMPLE 2

According to this Example, each of the active and dummy cells comprises a lower electrode and a dielectric film which are obtained by epitaxial growth. The dielectric film of the active cell is a strain inducing film which utilizes the mismatching strain with reference to the lower electrode. The dielectric film of the dummy current is a paraelectric film obtained by varying the composition of the lower electrode for lattice matching. By use of these cells, a ferroelectric memory is fabricated. The structure, composition and manufacturing method of the active cell are very similar to these of the active cell of Example 1.

The capacitor cell of Example 2 was obtained by epitaxially growing a platinum lower electrode (lattice constant:

0.3923 nm) and a BST dielectric film having a Ba content of 80% (lattice constant in axis a: 0.3982 nm) in a (100) azimuth. As a result of this epitaxial growth, ferroelectricities are induced in accordance with the 1.5% lattice mismatching, and a capacitor cell having a residual polarization of 0.12 $C/m^2$ could be fabricated.

The structure and manufacturing method of the dummy cell are substantially similar to those of the active cell, except that the lower electrode is formed of a Pt-15%Ta alloy. The lattice constant of the Pt-15%Ta alloy is 0.3975 nm, and this value differs from the lattice constant (0.3982 nm) of the dielectric film (i.e., the BST dielectric film whose Ba content is 80%) by 0.18% only. This being so, ferroelectricities were not induced in the epitaxially grown BST dielectric film. The BST dielectric film was a paraelectric film having a dielectric constant of 310.

It was confirmed that the device of Example 2 functioned as a nonvolatile semiconductor memory device in a very stable manner by using the above active and dummy cells in combination.

EXAMPLE 3

According to this Example, an active cell was manufactured in a similar manner to that of the active cell of Example 2, except that the lower electrode was formed of $SrRuO_3$.

To be more specific, a lower electrode of $SrRuO_3$ (lattice constant: 0.3930 nm) and a BST dielectric film having a Ba content of 80% (lattice constant in axis a: 0.3982 nm) were epitaxially grown in a (100) azimuth. As a result of this epitaxial growth, ferro-electricities are induced in the dielectric film in accordance with the 1.3% lattice mismatching, and a capacitor cell having a residual polarization of 0.22 $C/m^2$ could be fabricated.

A dummy cell was manufactured in a similar manner to that of the dummy cell of Example 2, except that the lower electrode was formed of a mixed crystal (lattice constant: 0.3985 nm) containing 80% of $SrMoO_3$ and 20% of $BaMoO_3$ in a molar ratio.

The dielectric thin-film capacitor of the dummy cell was measured to check its characteristics. The measurement showed that the thin-film capacitor did not exhibit ferroelectricities. The thin-film capacitor of the dummy cell had a dielectric constant of 420 when a bias of 0V was applied thereto, and was therefore paraelectric. It was also confirmed that the device of Example 3 functioned as a nonvolatile semiconductor memory device in a very stable manner by using the active and dummy cells in combination.

EXAMPLE 4

According to this Example, each of the active and dummy cells comprises a lower electrode and a dielectric film which are obtained by epitaxial growth. However, the dielectric films of the active and dummy cells are made to differ in composition, such that the dielectric film of the active cell functions as a ferroelectric film and that of the dummy cell functions as a paraelectric film. By use of these two kinds of cells, a ferroelectric memory was fabricated.

The structure, composition and manufacturing method of the active cell of Example 4 are very similar to those of the active cell of Example 1.

To be more specific, a lower electrode of platinum (lattice constant: 0.3982 nm) and a BST dielectric film having a Ba content of 80% (lattice constant in axis a: 0.3982 nm) were epitaxially grown in a (100) azimuth. As a result of this epitaxial growth, ferro-electricities are induced in the dielectric film in accordance with the 1.5% lattice mismatching, and a capacitor cell having a residual polarization of 0.12 $C/m^2$ could be fabricated.

The structure and manufacturing method of a dummy cell are substantially similar to those of the active cell, except that the lower electrode was formed of a BST dielectric film having a Ba content of 20%. The lattice constant of this BST dielectric film is 0.3925 nm and does not differ from the lattice constant of the lower electrode of Pt. In addition, the original Curie temperature of the BST dielectric film is $-100°$ C. and is therefore paraelectric. Therefore, the epitaxially grown BST dielectric film having a Ba content of 20% was a paraelectrics having a dielectric constant of 280.

It was confirmed that the device of Example 4 functioned as a nonvolatile semiconductor memory device in a very stable manner by using the above active and dummy cells in combination.

EXAMPLE 5

According to this Example, not only an FRAM but also a DRAM are fabricated on the same substrate. The DRAM comprises a paraelectric cell which is manufactured in a similar manner to that of the dummy cell of the FRAM. The memory cell of the DRAM is substantially similar in structure to the dummy cell of the FRAM. In fact, the memory cell of the DRAM and the dummy cell of the FRAM are manufactured in similar methods.

As in Example 3, a lower electrode of $SrRuO_3$ (lattice constant: 0.3930 nm) having a thickness of 50 nm, and a BST dielectric film having a Ba content of 80% (lattice constant in axis a: 0.3982 nm) having a thickness of 30 nm, were epitaxially grown in a (100) azimuth. As a result of this epitaxial growth, ferroelectricities are induced in the dielectric film in accordance with the 1.3% lattice mismatching, and a capacitor cell having a residual polarization of 0.22 $C/m^2$ could be fabricated.

The dummy cell of the FRAM and the cell of the DRAM were fabricated in a similar manner to that of the active cell of the FRAM, except that they were formed of BST dielectric films (lattice constant in axis a: 0.3925 nm) each having a thickness of 30 nm and a Ba content of 20%. Since these dielectric films and their lower electrodes were substantially in the lattice matching state, no ferroelectricities were observed in the dielectric films. The dielectric films were paraelectrics having a dielectric constant of 450.

In order to obtain the capacity of the dielectric capacitor of the DRAM by using a silicon oxide film instead of the paraelectric BST dielectric film, the silicon oxide film has to be very thin; it must be as thin as 2.7 angstroms or so. The leak current of the BST dielectric films having ferroelectricities was less than $5 \times 10^{-8}$ $A/cm^2$ when a voltage applied to the films was in the range of $\pm 3V$. It was therefore confirmed that the dielectric films of Example 5 were very suitable for use in a DRAM.

As described above, the present invention does not use lead or bismuth which is a low-melting point metal and cannot be easily used in a silicon process. According to the present invention, a ferroelectric film which is induced in accordance with the strain introduced in the epitaxial growth is used as a ferroelectric c ell, and a paraelectric film which is similar in structure and composition to the ferro-electric film is used as a paraelectric cell. The use of these two kinds of cells enables the manufacture of a nonvolatile semiconductor memory element which is very reliable in performance and highly integrated. Hence, the present invention provides remarkable industrial advantages.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device which comprises:

a ferroelectric cell and a paraelectric cell;

wherein said ferroelectric cell includes a first thin-film capacitor which comprises a first lower electrode formed on a substrate, a first dielectric film grown on the first lower electrode, and a first upper electrode formed on the first dielectric film, and a first switching transistor connected to the first thin-film capacitor, and wherein said paraelectric cell includes a second thin-film capacitor which comprises a second lower electrode, a second dielectric film grown on the second lower electrode, and a second upper electrode formed on the second dielectric film, and a second switching transistor connected to the second thin-film capacitor; and wherein the first and second dielectric films are formed of the same material and have a single crystal structure, each of the first and second lower electrodes have a single crystal structure, and dielectric characteristics of the first and second dielectric films are controlled by changing lattice constants of the first and second-lower electrodes.

2. A nonvolatile semiconductor memory device according to claim 1, wherein said first and second dielectric films are epitaxially grown on the first and second lower electrodes, respectively, and said first lower electrode has a lattice constant which is smaller than that of the second lower electrode by 0.2% or more.

3. A nonvolatile semiconductor memory device according to claim 1, wherein said first and second dielectric films are formed of barium/strontium titanate, and said first dielectric film is made to have ferroelectricities by residual strain produced therein.

4. A nonvolatile semiconductor memory device according to claim 1, wherein at least one of said first and second lower electrodes is formed of Pt.

5. A nonvolatile semiconductor memory device according to claim 1, wherein at least one of said first and second lower electrodes is formed of a mixed crystal made from a plurality of conductive compounds, and dielectric characteristics of the first and second dielectric films are controlled by changing composition of the mixed crystal.

6. A nonvolatile semiconductor memory device according to claim 5, wherein said plurality of conductive compounds are selected from the group consisting of $BaRuO_3$, $SrRuO_3$ and $CaRuO_3$.

7. A method for manufacturing a nonvolatile semiconductor memory device, comprising the steps of:

forming a first lower electrode and a second lower electrode on a substrate, wherein lattice constants of the first lower electrode are different from those of the second lower electrode, and each of the first and second lower electrodes have a single crystal structure;

forming a first dielectric film having ferroelectricities and a second dielectric film have paraelectricities simultaneously on the first and second lower electrodes, respectively, under epitaxial growth condition, the first and second dielectric films have a single crystal structure and are formed of the same material which has a lattice constant different from that of the first lower electrode; and providing a first upper electrode on the first dielectric film, thereby forming a ferroelectric cell, and providing a second upper electrode on the second dielectric film, thereby forming a paraelectric cell.

8. A nonvolatile semiconductor memory device which comprises:

a ferroelectric cell and a paraelectric cell;

wherein said ferroelectric cell includes a first thin-film capacitor which comprises a first lower electrode formed on a substrate, a first dielectric film grown on the first lower electrode, and a first upper electrode formed on the first dielectric film, and a first switching transistor connected to the first thin-film capacitor; and wherein said paraelectric cell includes a second thin-film capacitor which comprises a second lower electrode, a second dielectric film grown on the second lower electrode, and a second upper electrode formed on the second dielectric film, and a second switching transistor connected to the second thin-film capacitor; and wherein the first and second dielectric films are formed of the same material, the first dielectric film and the first lower electrode have a single crystal structure, the second dielectric film and the second electrode have a polycrystalline structure, and dielectric characteristics of the first and second dielectric films are controlled by crystallinities of the first and the second lower electrodes.

9. A nonvolatile semiconductor memory device according to claim 8, wherein said first and second dielectric films are formed of barium/strontium titanate, and said first dielectric film is made to have ferroelectricities by residual strain produced therein.

10. A nonvolatile semiconductor memory device according to claim 8, wherein at least one of said first and second lower electrodes is formed of Pt.

11. A nonvolatile semiconductor memory device according to claim 8, wherein said first and second lower electrodes are formed of the same material.

12. A nonvolatile semiconductor memory device according to claim 8, wherein at least one of said first and second lower electrodes is formed of a mixed crystal made from a plurality of conductive compounds.

13. A nonvolatile semiconductor memory device according to claim 12, wherein said plurality of conductive compounds are selected from the group consisting of $BaRuO_3$, $SrRuO_3$ and $CaRuO_3$.

14. A method according to claim 7, wherein said first and second dielectric films are epitaxially grown on the first and second lower electrodes, respectively, and said first lower electrode has a lattice constant which is smaller than that of the second lower electrode by 0.2% or more.

15. A method according to claim 7, wherein said first and second dielectric films are formed of barium/strontium titanate, and said first dielectric film is made to have ferroelectricities by residual strain produced therein.

16. A method according to claim 7, wherein one of said first and second lower electrodes is formed of Pt.

17. A method according to claim 7, wherein at least one of said first and second lower electrodes is formed of a mixed crystal made from a plurality of conductive compounds, and the dielectric characteristics of the first and second dielectric films are controlled by changing composition of the mixed crystal.

18. A method according to claim 7, wherein said plurality of conductive compounds are selected from the group consisting of $BaRuO_3$, $SrRuO_3$ and $CaRuO_3$.

19. A method for manufacturing a nonvolatile semiconductor memory device, comprising the steps of:

forming a first lower electrode and a second lower electrode, which has a roughened surface, on a substrate;

forming a first dielectric film having ferroelectricities and a second dielectric film having paraelectricities simultaneously on the first and second lower electrodes, respectively, under epitaxial growth condition, the first and second dielectric films being formed of the same material which has a lattice constant different from that of the first lower electrode, said first dielectric film having a single crystal structure, and said second dielectric film having a polycrystalline structure; and providing a first upper electrode on the first dielectric film, thereby forming a ferroelectric cell, and providing a second upper electrode on the second dielectric film, thereby forming a paraelectric cell.

20. A method according to claim 19, wherein said first and second lower electrodes are formed of the same material.

21. A method according to claim 19, wherein said first and second dielectric films are formed of barium/strontium titanate, and said first dielectric film is made to have ferroelectricities by residual strain produced therein.

22. A method according to claim 19, wherein at least one of said first and second lower electrodes is formed of a mixed crystal made from a plurality of conductive compounds.

23. A method according to claim 22, wherein said plurality of conductive compounds are selected from the group consisting of $BaRuO_3$, $SrRuO_3$ and $CaRuO_3$.

24. A method according to claim 19, wherein at least one of said first and second lower electrodes is formed of Pt.

* * * * *